United States Patent [19]

Phillips et al.

[11] Patent Number: 4,640,002
[45] Date of Patent: Feb. 3, 1987

[54] METHOD AND APPARATUS FOR INCREASING THE DURABILITY AND YIELD OF THIN FILM PHOTOVOLTAIC DEVICES

[75] Inventors: James E. Phillips; Patrick G. Lasswell, both of Newark, Del.

[73] Assignee: The University of Delaware, Newark, Del.

[21] Appl. No.: 805,435

[22] Filed: Dec. 5, 1985

Related U.S. Application Data

[63] Continuation of Ser. No. 352,218, Feb. 25, 1982, abandoned.

[51] Int. Cl.$^4$ .......................................... H01L 31/18
[52] U.S. Cl. ......................................... 29/574; 29/572; 29/575; 29/584; 136/290; 324/158 D; 356/237
[58] Field of Search ............... 29/572, 574, 575, 584; 136/243, 290; 324/158 D; 219/121 LE, 121 LF; 356/237

[56] References Cited

U.S. PATENT DOCUMENTS

| | | | |
|---|---|---|---|
| 2,820,841 | 1/1958 | Carlson | 136/258 |
| 4,166,918 | 9/1979 | Nostrand et al. | 136/243 |
| 4,197,141 | 4/1980 | Bozler | 136/258 |
| 4,205,265 | 5/1980 | Staebler | 324/158 D |
| 4,287,473 | 9/1981 | Sawyer | 324/158 R |
| 4,301,409 | 11/1981 | Miller et al. | 324/158 D |
| 4,385,971 | 5/1983 | Swartz | 204/129.1 |
| 4,451,970 | 6/1984 | Izu et al. | 29/574 |

FOREIGN PATENT DOCUMENTS 56-69872  6/1981  Japan .................................. 136/290

OTHER PUBLICATIONS

NBS Special Publication, 400-24 (1977).
K. Lehovec et al., *Solid State Electronics*, vol. 23, pp. 565-576 (1980).
B. C. Plunkett et al., *SPIE*, vol. 248, pp. 142-147 (1980).
P. G. Lasswell et al., *Conf. Record, 15th IEEE Photovoltaic Specialists Conf.* (1981), pp. 1021-1024.
D. E. Carlson et al., Quarterly Reports, SERI Subcontract XJ-9-825, Jan., Apr. and Dec., 1979, pp. 42-44, 26-27, 13-15, respectively.
Int'l Workshop on Cadmium Sulfide Solar Cells . . . 1975, Univ. of Delaware, pp. 575-583 and 268-270.
Proceedings of SERI Subcontractors Review Meeting, Wash., DC, (Sep. 1980), pp. 173, 179.
W. F. Lankford et al., NBSIR 81-2260, Report to SERI.
H. W. Schock et al., "Technology of Large Area $Cu_2$-S-CdS Solar Cells".
R. T. Young et al., *IEEE Trans. Electron Devices*, vol. ED-27 (1980), pp. 807-814 (1980).
J. C. Miller et al., *IEEE Trans. Electron Devices*, vol. ED-27, pp. 815-821 (1980).
R. W. Birkmire et al., Quarterly Report XS-9-83-09-1-09 to SERI, Feb. 1982.
IBM Technical Disclosure Bulletin, vol. 24, No. 11B, by S. M. Saleem and R. L. Verkuil, Apr. 1982, Contactless Electrical Isolation Detector, p. 6027.
Optics and Laser Technology, vol. 12, No. 6, Technical Note, Automatic Inspection of Silicon Wafers, Dec. 1980, pp. 317-320.
IEEE Transactions on Electron Devices, vol. ED-27, by Sawyer and Kessler, Laser Scanning of Solar Cells for the Display of Cell Operating Characteristics and Detection of Cell Defects, 1980, pp. 864-872.
IBM Technical Disclosure Bulletin, vol. 19, No. 4, by J. P. Hoekstra, Sep. 1976, Testing a Multilevel Line Structure for Shorts, pp. 1457-145.

*Primary Examiner*—Aaron Weisstuch
*Attorney, Agent, or Firm*—Connolly and Hutz

[57] ABSTRACT

Thin film photovoltaic cells having a pair of semiconductor layers between an opaque and a transparent electrical contact are manufactured in a method which includes the step of scanning one of the semiconductor layers to determine the location of any possible shorting defect. Upon the detection of such defect, the defect is eliminated to increase the durability and yield of the photovoltaic device.

17 Claims, 10 Drawing Figures

U.S. Patent  Feb. 3, 1987  Sheet 2 of 4  4,640,002
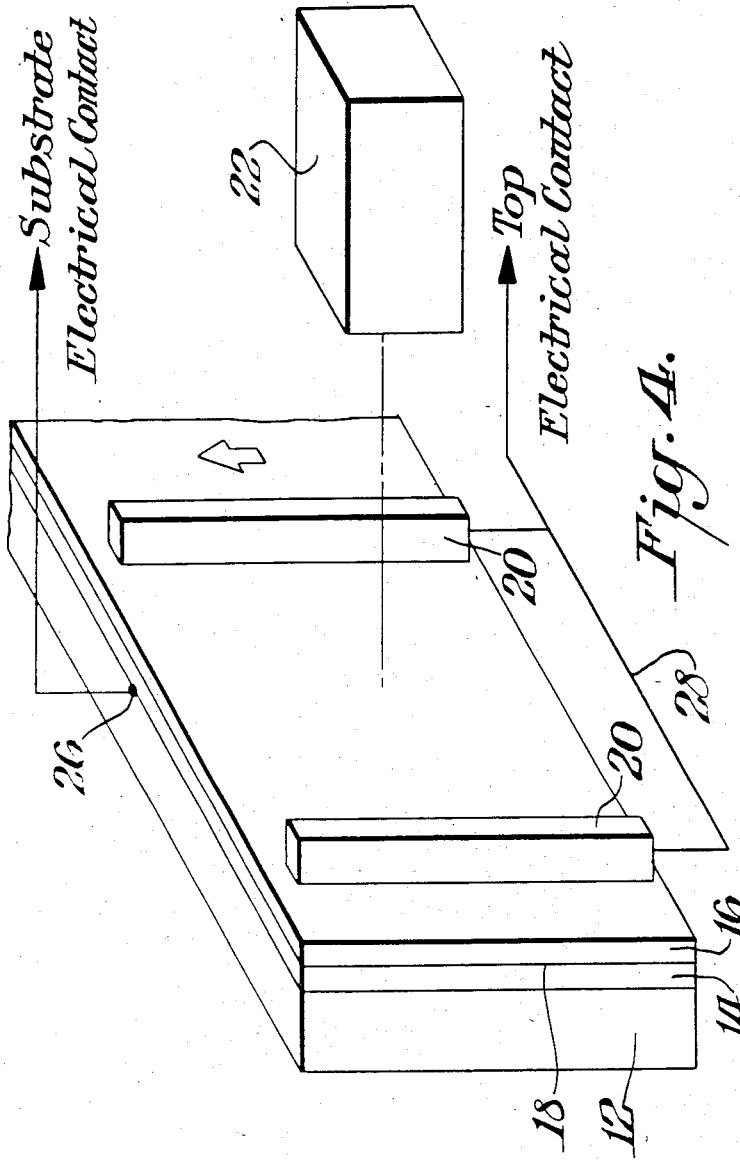
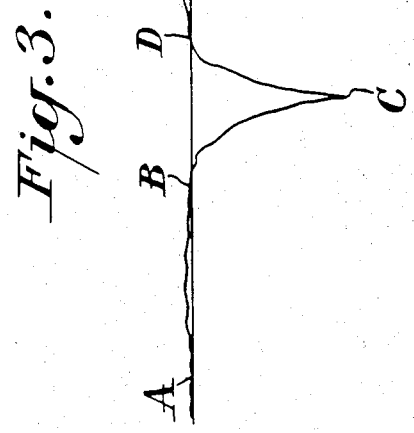
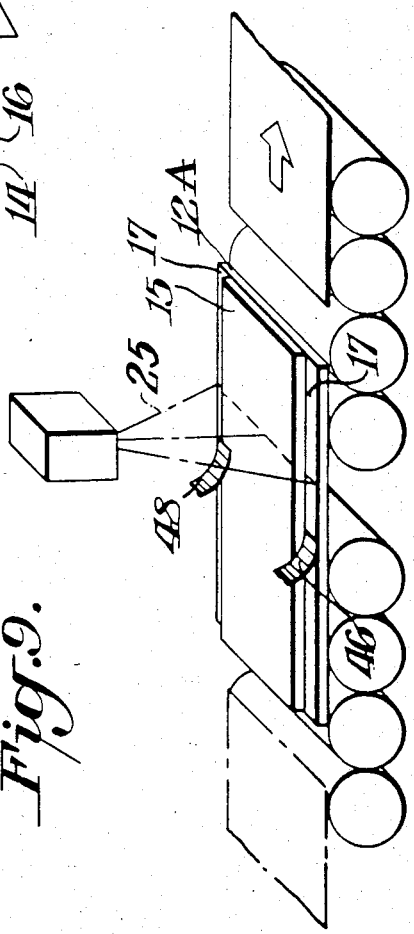

METHOD AND APPARATUS FOR INCREASING THE DURABILITY AND YIELD OF THIN FILM PHOTOVOLTAIC DEVICES

This invention was made with Government support, and the Government has certain rights in the invention pursuant to Subcontract No. XS-9-8309-1 awarded by the Solar Energy Research Institute under U.S. Dept. of Energy Contract No. EG-77-C-01-4042.

CROSS-REFERENCE TO RELATED APPLICATION

This application is a continuation application application of Ser. No. 352,218 filed Feb. 25, 1982, now abandoned.

BACKGROUND OF INVENTION

Thin film photovoltaic cells or devices generally include an opaque electrical contact which serves as a substrate upon which a first semiconductor layer is applied. A second semiconductor layer is then formed or applied to the first semiconductor layer with an electrical junction formed therebetween. Finally, a second electrical contact is applied to the second semiconductor layer. Such structure involves the basic components of a thin film photovoltaic cell. Numerous variations including the manner of forming the various layers, the materials, etc., are known and practiced in the art. For example, one such practice involves the formation of cadmium sulfide and copper sulfide and semiconductor layers. Other known semiconductor materials include amorphous silicon and zinc phosphide. Additionally such cells have been formed by using, for example, copper-indiuim-selenide on cadmium sulfide or zinc cadmium sulfide. In order for such photovoltaic devices to have the desired durability and yield, the semiconductor layers should be free of defects which might otherwise cause shorts. For example, commonly assigned U.S. Pat. No. 4,215,286 discusses the possible electrical shorts that may result in such cells. This patent discloses attempts to avoid such shorts by providing blocking layer material where necessary to prevent the undesired contact between non-adjacent layers.

It would be desirable to avoid such electrical shorts in other manners than described in the aforesaid patent.

SUMMARY OF INVENTION

An object of this invention is to provide a method and apparatus for detecting the location of shorting defects in thin film semiconductor layers and then eliminating such defects so as to increase the durability and yield of the photovoltaic devices made therefrom.

In accordance with this invention, the layers are scanned in such a manner to precisely locate a potentially shorting defect. By so locating the defect, it is possible to remove the defect itself thus obviating the need for applying any special added material to function, for example, as a blocking layer. Furthermore, locating and eliminating shunting defects is accomplished during the manufacture of a photovoltaic device, before final application of a second electrical contact.

In accordance with a preferred embodiment of this invention a laser is used for scanning the semiconductor layer in association with a display screen which would indicate the detection of a defect. The display screen would correspond by the xy coordinate system to the semiconductor layer being scanned so that the precise location of the defect would be known and thus it could be eliminated. One manner of eliminating the defect would be by the use of an electrically conductive wire applied thereto. In the preferred practice of the invention, however, the same laser equipment used for locating the defect is also used to eliminate it. This could be done by scanning the semiconductor when the laser equipment is operating under its low power mode and then eliminating the defect when the laser equipment is under its high power mode.

The invention and particularly the use of the laser equipment lends itself for incorporation in a system wherein a plurality of stations are arranged seriatim for the continuous manufacture of thin film photovoltaic devices.

THE DRAWINGS

FIG. 3 illustrates a typical line pattern that would be produced on the display screen of FIG. 1 when a defect is detected;

FIG. 4 is a perspective view showing the application of the laser contacts to the components of an incomplete photovoltaic device in accordance with this invention;

FIG. 9 is a schematic diagram of a scanning and defect elimination station in the manufacture of thin film photovoltaic devices on non-conductive substrates; and FIG. 10 is a further form of device with which the invention deals.

DETAILED DESCRIPTION

Figure 1:
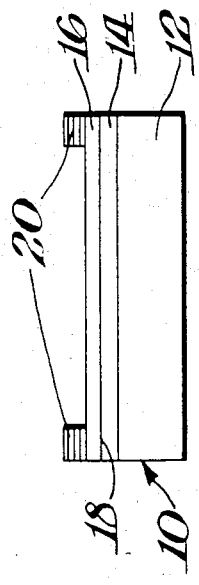
FIG. 1 is a cross-sectional view in elevation of a typical thin film semiconductor layer structure with which the invention deals.

The present invention is directed to thin film photovoltaic devices which are essentially free of shorts and shunts. Shunts and short circuits are well known to reduce the energy conversion efficiency of photovoltaic devices. Since large areas of photovoltaic devices must be manufactured and deployed at low cost if such devices are to be useful for practical generation of electricity, the incidence of shorts and shunts reduces production yield and increases cost. Furthermore, certain types of shunts, such as, for example, in photovoltaic devices comprising copper sulfide as one of its semiconductor layers, cause rapid degradation of efficiency upon deployment, even when the initial magnitude of the shunt resistance is too high to be significant in an initial test of the efficiency of a photovoltaic device. Such shunts are the result of a variety of defects in the semiconductor layer of a thin film photovoltaic device such as pinholes, cracks, inclusions and the like. Applicants have recognized that although thin film semiconductor layers for photovoltaic devices may be characterized by many such defects, not all defects are associated with shunting and short circuiting. The present invention is directed to the detecting of the location of a shunting defect in thin film semiconductor layers and, upon such detection, of the elimination of such shunting defect so as to provide a means for producing thin photovoltaic devices having increased efficiency, manufacturing yield, and reliability.

In the preferred practice of this invention, a laser scanner is employed. Laser scanners have previously been used in connection with thin film photovoltaic devices. Such prior art uses, however, have generally been in order to survey completed devices to determine, for example, cosmetic imperfections, response uniformity and imperfections in contact metallization, and generally not for scanning incomplete cells during the process of manufacture. Such prior art uses are, furthermore, confined to completed cells so that shunting defects which are covered by contact metallizations, grid lines or other types of transparent contacts cannot be detected and eliminated without damaging the cell device.

The present invention includes as its novelty the use of such scanning equipment, in general, and laser scanners, in particular, in the manner set forth hereinafter, but such laser equipment, per se, and even with thin film photovoltaic cells, is not asserted to be novel. For example, NBS Special Publication 400-24, February 1977 by Sawyer and Berning describes a laser scanner for semiconductive devices. Further descriptions of laser scanners are also found in *IEEE Transactions on Electron Devices*, Vol. ED-27, No. 4, April 1980, pp. 864–872; *Solid State Electronics*, Vol. 23, pp. 565–576, 1979; *Proc. SPIE 24th Annual Int'l. Technical Symposium*, Vol. 248, pp. 142–147, 1980; *Photovoltaic Specialists Conference*, pp. 1021–1024, 1981; U.S. Pat. No. 4,205,265; Quarterly reports to SERI under Subcontract No. XJ-9-8254 prepared by Carlson et al and dated January, April and December 1979; N. C. Wyeth, "Optical Spot Scanning of Cu$_2$S-CdS Cells", International Workshop on Cadmium Sulfide Solar Cells and Other Abrupt Heterojunctions, April 30–May 2, 1975, Univ. of Delaware, pp. 575–583; Proceedings of SERI Subcontractors Review Meeting, Washington, D.C., Sept. 3–5, 1980; "Aspects of Cu$_x$S-CdS Solar Cells", Apr. 30–May 2, 1975, Univ. of Delaware, pp. 268–269; Mostek (Div. of UTC), Electronic Design, Sept. 30, 1981, pp. 104–105; NBS report NBSIR 81-2260 to SERI dated May 1981; and U.S. Pat. No. 4,197,141. The details of the afore-mentioned publications and patents are incorporated herein by reference thereto. The invention departs from the state of the art by recognizing that such laser equipment can be used for detecting the precise location of shunting defects and then eliminating such defects. The use of laser equipment represents the preferred manner of practicing the invention. In view of the state of the art, however, a detailed description of suitable laser equipment herein is not necessary except as it specifically applies to the practice of the invention.

Generally, complete thin film photovoltaic devices or cells include as the transparent electrical contact a component which is either in grid form or which may be a complete continuous layer. The invention is practiced with the use of a laser by applying temporary contacts to one semiconductor layer and completing the electrical circuit by connecting to the ohmic electrical contact of the other semiconductor layer. A display screen indicates by a straight line where there is no defect, but an irregularity in the line results on the display screen where there is a shunting defect to thereby clearly indicate the precise location of that defect.

FIG. 1 illustrates typical thin film semiconductor layers of a photovoltaic structure which, in accordance with the invention, would be scanned to locate shunting defects and the shunting defects would be eliminated. As indicated therein, structure 10 includes a substrate 12 which comprises an ohmic electrical contact.

A first semiconductor layer 14 is formed on or placed in contact with substrate 12 such that ohmic contact is made. If substrate 12 is a conductor such as a metal foil or graphite sheet or a heavily doped semiconductor such as impure silicon sheet, the exposed portions of substrate 12 not in contact with and opposite layer 14 are used for connecting to an electrical circuit. When the body of substrate 12 is an insulator or poor conductor such as glass, ceramic, polymer film, mica and the like, means which are apparent to those skilled in the semiconductor art must be incorporated to the structure so as to provide electrical connection to layer 14 via the ohmic contact inherent in substrate 12.

A second semiconductor layer 16 is formed on the semiconductor layer 14. Layer 16 may also be an oppositely doped region of layer 14. In either case, a rectifying junction 18 is located between layers 14 and 16. Electrical contact to layer 16 in accordance with this invention is provided by temporary contact means 20.

Examples of particular semiconductor layers and the photovoltaic devices to which they relate are as follows: Cu$_2$S/CdS where substrate 12 is zinc plated copper foil or tin oxide coated glass, layer 14 is CdS or more specifically $(Zn_xCd_{1-x})S$ where $0 \leq x \leq 0.3$, and layer 16 is Cu$_2$S; CuInSe$_2$/CdS where substrate 12 is a metallized ceramic, layer 14 is CuInSe$_2$, and layer 16 is CdS or $(Zn_xCd_{1-x})S$; a-Si, where layer 12 is glass upon which has been deposited a conductive oxide such as tin oxide, indium-tin-oxide or metal film or cermet layer, layer 14 a composite of layers of n-type amorphous silicon upon which is formed an undoped i layer of amorphous silicon, and layer 16 is p-type amorphous silicon or silicon carbide or p-type microcrystalline silicon, polysilicon, where layer 12 is a graphite or metal foil, and layers 14 and 16 are oppositely doped layers of polycrystalline silicon.

One of the problems which adversely affect the durability and yield of thin film photovoltaic cell devices is that small defects occur in one of the semiconductor layers whereby undesired electrical contact results between the components of the device which should be spaced from each other. For example, a defect or hole in inner semiconductor layer 14 could result in material from top semiconductor layer 16 making electrical contact with the conducting substrate 12 which would cause localized shorting. Similarly, defects in top semiconducting layer 16 might cause electrical contact between the inner semiconducting layer 14 and the second electrical contacts which must be applied to layer 16 in order to complete a practical photovoltaic device.

In the particular case of photovoltaic cell devices comprising copper sulfide, any low resistance electrical path between copper sulfide and the substrate causes electromigration of copper and ultimate electrochemical decomposition of copper sulfide into, inter alia, a nodule or whisker of copper. This electrochemical decomposition of copper sulfide is recognized as one of the principal factors limiting widespread utilization of copper sulfide comprising photovoltaic cell devices. Elimination of shunting defects in accordance with this invention provides a useful means for obtaining $Cu_2S$ comprising photovoltaic cells having increased durability and reliability and which heretofore have been unavailable for utilization in photovoltaic power generation systems.

The present invention detects the location of such defects and then eliminates the defects to thereby increase the durabilty and yield of the devices. Location and elimination of shunting defects in accordance with this invention do not reduce the efficiency or utility of a photovoltaic cell and, if the practitioner desires, the invention may be practiced on complete photovoltaic cell devices having a permanent and/or integral transparent contact, although this mode is not preferred.

Figure 2:
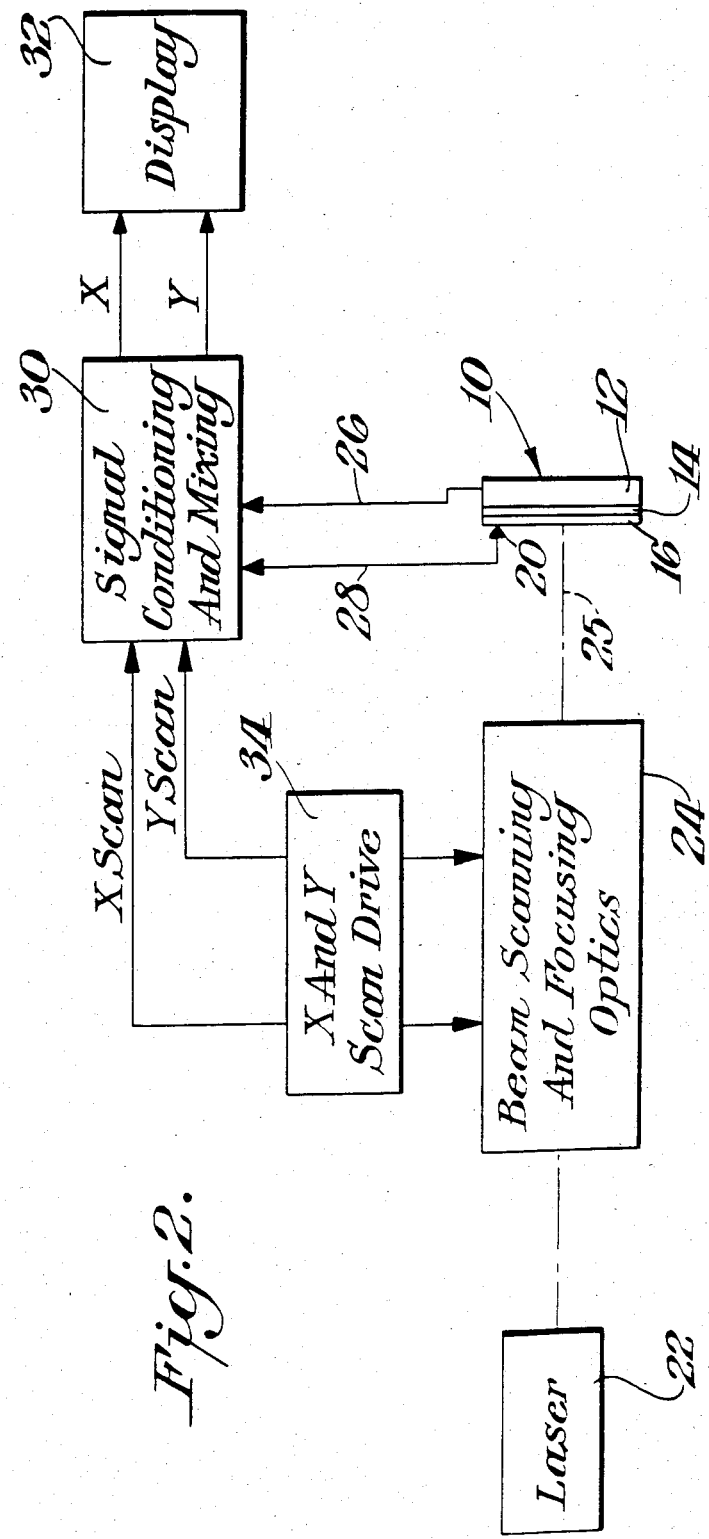
FIG. 2 is a block diagram schematically showing the scanning of a thin film photovoltaic semiconductor in accordance with this invention.

FIG. 2 schematically illustrates the use of a laser beam to scan and locate such defects. As indicated therein, the focused laser beam 25 is incident on semiconductor layer 16. The photovoltaic structure is being scanned during a stage of manufacture before a second permanent ohmic electrical contact has been applied to layer 16 to form a complete photovoltaic cell device. In general, electrical connections 26 and 28 are made to substrate 12 and temporary ohmic contact 20, respectively. Connections 26 and 28 are connected to a signal conditioning and mixing device which incorporates means for applying a bias voltage between the semiconducting layers. The polarity of the bias voltage is chosen so as to place rectifying junction 18 (see FIG. 1) in the condition known as reverse bias. In general, reverse biasing means that when layer 16 is a p-type semiconductor layer or region and layer 14 is an n-type semiconductor layer or region, layer 16 is at a voltage which is negative with respect to layer 14. When the conductivity types of layers 16 and 14 are n- and p-type, respectively, layer 16 is held at a voltage which is positive with respect to layer 14. The feature of reverse biasing is critical to the practice of the invention. The precise reverse bias voltages to be used in accordance with this invention depend, in general, on the semiconductor materials of layers 14 and 16 and on the sheet resistance of layer 16 and location of temporary contact 20 and on the characteristics of junction 18 in particular. When layer structure 10 is comprised of zinc plated copper foil 12, $(Zn_xCd_{1-x})S$ layer 14, $Cu_2S$ layer 16, and temporary contacts 20 are spaced 1 cm apart, a reverse bias of 0.2 to 0.8 volts has been found to be satisfactory and 0.5 volts most satisfactory. Selection of satisfactory revrese bias conditions for other semiconductor materials and temporary contact configuration would be obvious from the details disclosed herein and below. Also incorporated in the signal conditioning and mixing device 30 are means for detecting current generated in the cell by the action of laser beam 25. This current is commonly referred to as the light generated current of the photovoltaic effect. Laser beam 25 is generated by laser 22 and beam scanning and focusing optics 24. Beam scanning and focusing optics equipment 24 precisely locates the laser beams and focuses the beam to a spot which is, in practice, as small as 2 micron in diameter, although a 30 μm diameter spot has been satisfactory. The selection of laser 22 is governed initially by the wavelength of the emitted radiation. The wavelength must correspond to an energy which is greater than the bandgap of the semiconductor layer which functions as the absorber-generator of a photovoltaic cell device. Since photovoltaic cells which are intended for conversion of sunlight to electricity preferably have at least one semiconductor component with a bandgap less than 1.8 eV a helium-neon laser emitting 633 nanometer light, corresponding to a photon energy of about 2.0 eV, is generally suitable. The invention also has application to photovoltaic devices designed to operate with short wavelength radiation; however, in those cases, laser 22 must be chosen accordingly.

The exact location of beam 25 on the surface of layer 16 is determined by x and y scan drive 34 acting on the beam scanning component of 24. Electrical signals corresponding to the x and y coordinate positions of beam 25 on the surface of 16 are electrically mixed with conditioned signals corresponding to the light generated current flowing through connections 26 and 28. Thus, as beam 25 moves first across and then down and then across layer 16 in first the x direction, then the y and then x, the light generated current at a particular x and y coordinate position may be recorded and displayed on screen 32. Coordinates x and y and the corresponding light generated current may be displayed on a cathode ray screen to create a spatial image of the curret being generated in the semiconductor layers. The electrical signals generating the display image may also be digitized and stored. The stored information may be recalled to reconstruct the display image or, when fed into an appropriately connected microprocessor, be used to automatically direct subsequent processing operations in the manufacture and assembly of photovoltaic devices, components and systems.

The exact components which comprise items 22, 24, 30, 32 and 34 described in relation to FIG. 2 are more fully described in the prior art references cited above.

Reference is now made to FIG. 3 which shows a typical line pattern which would be displayed on the screen 32 during an x movement pass across layer 16. The line pattern of FIG. 3 was obtained for a structure of the type where substrate 12 was a zinc plated copper foil; layer 14 was a polycrystalline film of Cds; layer 16 was $Cu_2S$; and contacts 20 are graphite impregnated elastomer bars available from Zebra Stripe Inc. spaced 1 cm apart on the borders of structure 10. The reverse bias applied via connections 26 and 28 was 0.5 volts. Where there is no shunting defect in the semiconductor layers, the resulting pattern is a generally straight line as shown between points A and B in FIG. 3. Where a defect occurs, however, electrical contact is made between layer 12 and 16 of structure 10 resulting in a pronounced drop or irregularity in the display pattern as indicated by point C. The irregularity thus precisely indicates the location of a shunting defect. A beam 25 continues to move across layer 16 past the defect, a straight line pattern again forms as indicated by points D and E. The shunting defect point C is identified as such by the curvature of the line. If, by way of contrast, there had been simply a hole in layer 16 so that no current was generated at that point, a scan, not shown, would have appeared as a sharp downward spike having a width about equal to the size of the hole and lacking in curvature. The ability to distinguish and precisely locate shunting defects in accordance with this invention depends in part on the aforementioned reverse bias condition. A measure of sufficient reverse bias which the practitioner might use in accordance with this invention is provided by noting that the scan line return points A and E of FIG. 3 in the absence of a defect indicated by point C is perfectly horizontal.

The laser scanning of the semiconductor layer thus used the appropriate wavelength to generate a response in the photovoltaic device to locate a short. Upon locating such short, it is then possible to eliminate the defect without chemically processing the semiconductor layers or removing large areas of the semiconductor materials which might otherwise be utilized in a completed photovoltaic device. In one practice on the invention, the defect is burned out by applying any suitably positioned conductive wire at the location of the defect and then applying current through the wire at the position of the defect. Reverse bias of the photovoltaic device reduces the photovoltaic film conductivity in normal areas of the device to a minimum and thus insures that current from the wire flows only through the defect. Upon increasing the current through the wire, the high current density through the defect generates local heating sufficient to burn out the defect. Where the current is applied while the display screen is still on, the elimination of the defect would be apparent by the change of the pattern resulting on display screen 32. In an operative example carried out with a $Cu_2S/CdS/Zn/Cu$ foil structure and the apparatus described above, a gold wire was positioned to touch the $Cu_2S$ at a shunting defect which had been located in accord with this invention. The wire was connected to a DC power supply. After the voltage applied to the wire was increased to about $-1.5$ volts with respect to the foil substrate, a scan revealed that the shunting defect had been eliminated leaving a negligibly small area, about 0.01 $cm^2$ completely inactive. It is contemplated that with greater care the area affected may be reduced by a factor of one thousand.

Although a positioning wire may be used to thermally burn out a defect, the preferred practice of the invention involves the use of the same laser equipment to not only scan and locate the defect but also to eliminate the defect. For example, during the scanning step, the laser equipment would operate at its lower power mode of about 1–10 milliwatts. Upon location of the defect, the power would be increased to a high power mode to a magnitude of 1–10 watts which would precisely eliminate a shunting defect or short.

FIG. 4 illustrates a segment of a photovoltaic device during the scanning operation in the continuous production of photovoltaic cells as later described. In this embodiment, the contacts are stationary and the material moves relative thereto, while the laser beam is scanned only in the direction perpendicular to the motion of the semiconductor material and substrate, rather than moving the laser in both directions over the semiconductor material as previously described. In both embodiments, however, the laser scan locates defects so that the defects can thereby be eliminated.

As indicated in FIG. 4, a single electrical contact 26 is applied to substrate 12. A pair of temporary electrical contacts 20 are applied to top semiconducting layer 16. The p-n junction 18 is reverse biased as previously described. If there is a defect or hole in intermediate semiconducting layer 14, a short will result during scanning which would be indicated by a gradual reduction in current from the photovoltaic material. Such short would visually appear on the screen by the dip C. Upon detecting the defect, the laser output would then be increased at that location in order to remove the defect. When the defect disappears from screen 32, the scanning of the photovoltaic material would continue. Visual detection of a shunting defect and confirmation of its elimination by observing the display screen, while operable, is not preferred for automated manufacturing. As previously described, the location and detection of defects in accordance with this invention may be in the form of digital information suitable for processing by a computer or microprocessor. Such a computerized system can be programmed to recognize defects and direct a high power laser beam to eliminate the defect. Thus it is also within the scope of this invention to employ two lasers, the first a low powered interrogating beam to locate and identify shunting defects and a second, high powered laser to remove such defects.

The invention, in its preferred form, is thus particularly advantageous in that it provides for both the detection and elimination of shorting defects in a single step. Moreover, the invention thereby lends itself to application in the continuous thin film photovoltaic manufacturing process as later described. In this regard, electrical contacts 20 are a conductive roller or wiper. The material of the contact should be chosen so as not to damage the semiconductor material as it rubs against the contact roller or wiper. Preferred are contact rollers made from or coated with a conductive elastomer or polymeric coating which has been impregnated with conductive particles. At any rate, material of the wiper or roller should be chosen so as not to damage the semiconductor layer by abrasion, rubbing, cracking, and the like. Such contacts would also be suitable where the material is stationary and the contact moves. The laser equipment as used in this invention, could be automated with computer equipment which would monitor the electrical output of the photovoltaic material and automatically increase the laser power when a defect is detected.

Figure 5:
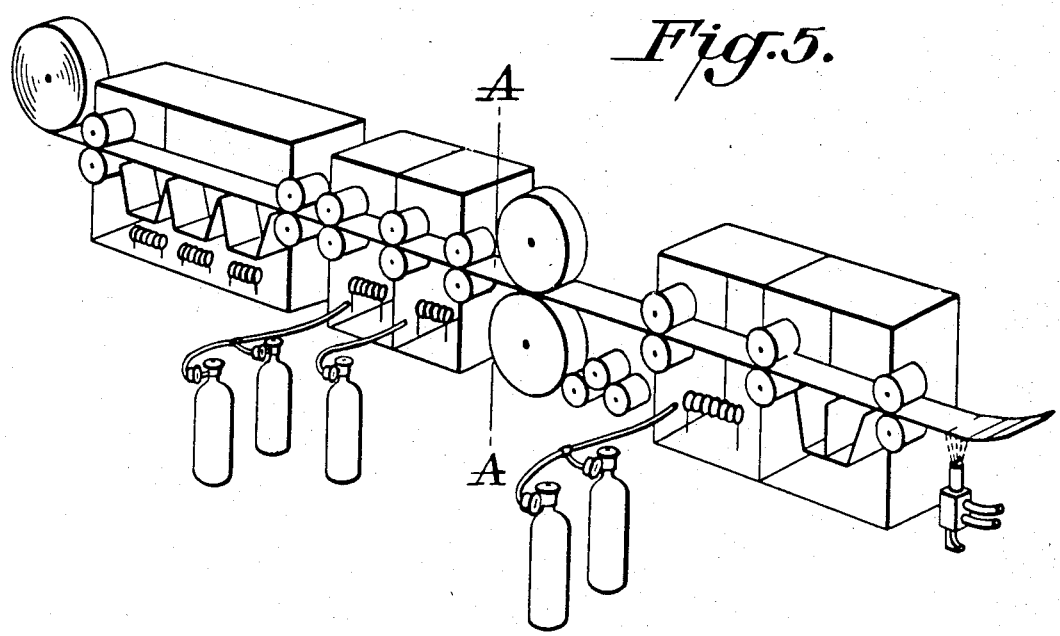
FIG. 5 is a schematic diagram showing the location of a scanning and defect elimination station in an arrangement for the continuous manufacture of thin film photovoltaic devices.
Figure 6:
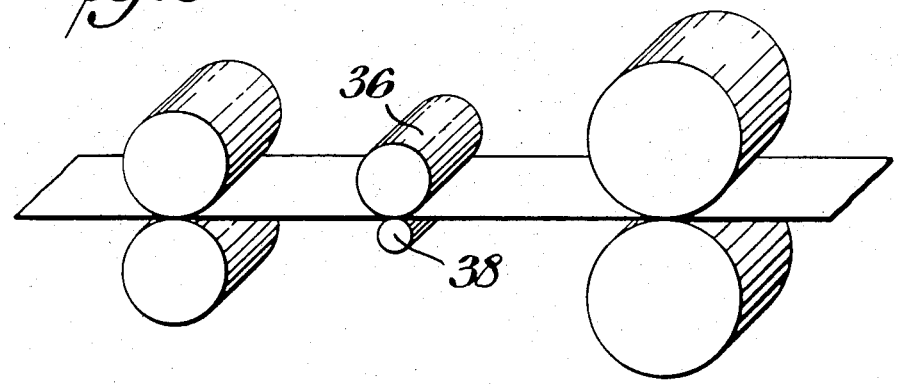
FIG. 6 is a detailed schematic diagram of the scanning and defect elimination station of FIG. 5.
Figure 7:
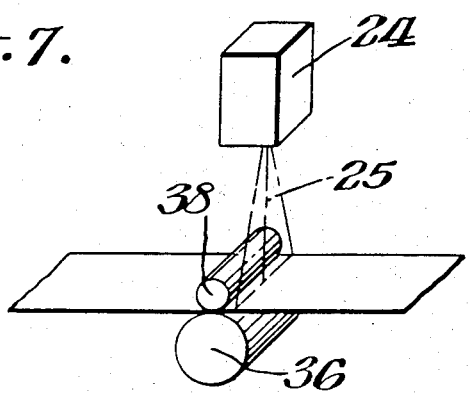
FIG. 7 is an inverted view of the station of FIG. 6.

FIG. 5 illustrates schematically a continuous thin film photovoltaic manufacturing process in which the invention could be incorporated. The general type of operation could be that of the type disclosed in commonly assigned application Ser. No. 43,315, filed May 29, 1979, now U.S. Pat. No. 4,318,938, the details of which are incorporated herein by reference thereto. In general, the process includes a substrate forming operation wherein a web of substrate material would then pass to the semiconductor application station for application of the first semiconductor layer. The composite would then pass to the second semiconductor application station for application of the second semiconductor layer and, if necessary, pass onto a step wherein the junction is formed. At this point the device would correspond to the photovoltaic structure illustrated in FIG. 4, and at this point the inventive scanning and defect eliminating step could be provided at line A—A of FIG. 5 so as to scan the semiconductor layers and to eliminate shunting defects. Details of the apparatus for locating and eliminating defects in accordance with this invention at location A—A of FIG. 5 are schematically shown in FIGS. 6 and 7. FIG. 6 shows contact roller 36 whose function corresponds to contact 26 of FIG. 4. Contact roller 38 corresponds to contact 20 of FIG. 4 (electrical connections 26 and 28 are not shown in FIG. 6). The detail of FIG. 7 is inverted from FIG. 6 in order to illustrate placement of the beam scanning and focusing optics. Laser beam 25 scans perpendicular to the direction of movement of the photovoltaic structure as previously described in connection with FIG. 4. By use of the roller type contacts, the scanning could occur while the composite material is moving to the step comprising application of the second electrical contact.

Figure 8:
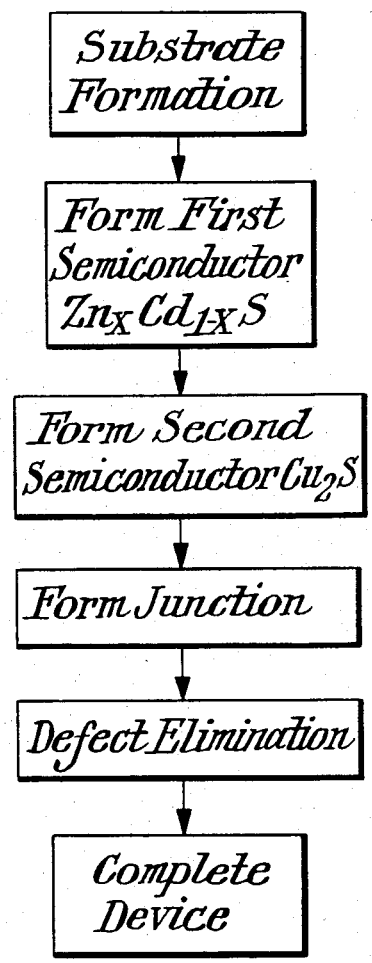
FIG. 8 is a schematic block diagram of the steps comprising manufacture of a $Cu_2S/CdS$ cell with improved stability.

The invention has been particularly described with respect to semiconductor layers comprising a photovoltaic cell device formed on a metal foil substrate. One such cell is the $Cu_2S/CdS$ type cell which is formed on a zinc plated copper foil or zinc and copper plated iron-nickel sheet. Cells of this type are described in a publication by J. A. Bragagnolo et al which appeared in *IEEE Transactions on Electron Devices*, Vol. ED-27(4), p. 645 (1980). As previously described, applicants have recognized that shunting defects such as are eliminated in accordance with this invention are the principal cause of degradation in efficiency and unreliability of $Cu_2S/CdS$ cells. Thus, for example, $CdS/Cu_2S$ cells similar in type to those described in the publication of Bragagnolo et al are known to degrade rapidly in efficiency when placed under continuous illumination of natural sunlight or its equivalent under conditions of forward bias near the maximum power point. In particular, cells exposed under these conditions are found to degrade in a manner characterized by reduction in fill factor and open circuit voltage. A discussion of this mode of degradation is given in the publication of J. Besson et al in the *Proceedings of the 11th IEEE Photovoltaics Specialists Conference*, pp. 468–475 (1975). FIG. 8 schematically illustrates the preparation of $Cu_2S/CdS$ or $Cu_2S/Zn_xCd_{1-x}S$ cells having increased stability. In the first step the substrate is prepared, in the second step a layer of CdS or $(Zn_xCd_{1-x})S$ is formed, in the third step a layer of $Cu_2S$ is formed, in the fourth step the retifying junction is formed. These steps are carried out by well known procedures such as are described in the paper of Bragagnolo. In the fifth step the inventive apparatus and method described herein are employed to detect and eliminate shunting defects. In the sixth step, the photovoltaic cell is completed by application of a transparent second electrical contact, antireflection coatings and encapsulants. The sixth step also includes intermediate steps comprising heat treatments and application of a blocking layer as taught in U.S. Pat. No. 4,215,286. The invention is also useful in improving the durability, reliability and yield of integrated photovoltaic modules comprising $Cu_2S/CdS$ such as are described in U.S. Pat. No. 4,127,424.

It is a particular advantage of this invention that $Cu_2S/CdS$ or $Cu_2S/Zn_xCd_{1-x}S$ photovoltaic devices having improved stability can be made with CdS or $Zn_xCd_{1-x}S$ layer thicknesses less than 10 microns thick. The practice of this invention is immediately applicable to $CdS/Cu_2S$ cells of the back-wall type in which CdS is deposited by a pyrolytic spray process on glass which has been first coated with a transparent conductive oxide such as tin oxide. Photovoltaic devices of this type and others consisting essentially of amorphous silicon are described in published material by Photon Power Corporation and a publication by J. J. Hanak in *Solar Energy*, Vol. 23, pages 145–147 (1979), respectively. In these types of devices the semiconductor layers are deposited on a large area glass sheet. The semiconductor layers are then etched and interconnected in order to form a plurality of strip photovoltaic cells which are electrically connected in a photovoltaic module. It is recognized in the prior art that unless shunts and shorts are prevented, serious decreases in array efficiency and reliability could occur and may require discarding an entire array which can be as large as several square feet. The prior art has proposed the use of intermediate layers such as an $Al_2O_3$-CdS composite of U.S. Pat. No. 4,159,914 in one case and a ceramic buffer layer in another in order to prevent shorts and shunts. The present invention provides a superior means for increasing the yield and durability of these types of photovoltaic devices as well. In FIG. 9 is shown a schematic diagram of an apparatus for practicing this invention when the substrate in a continuous manufacture process is a large glass sheet upon which a plurality of $Cu_2S/CdS$ or amorphous silicon cells are to be formed and integrated. In connection with FIG. 9, FIG. 10 shows the photovoltaic structure where substrate 12A is a sheet of glass having a transparent oxide coating 13. The semiconductor layers of the cell, e.g. CdS and $Cu_2S$ or amorphous silicon doped consecutively n-i-p type are denoted as 15. A portion of the transparent conductive oxide 13 is exposed along a continuous edge 17. This may be accomplished by selectively depositing the semiconductor layers through a mask or by etching or mechanically removing semiconductor material. The manufacturing process involves moving the substrate on a carrier or rollers through the steps of semiconductor deposition and junction formation. After these steps have been completed and prior to metallization, temporary contact is made to the transparent conductive oxide and to the uppermost semiconductor layer. Contact to the transparent conductive oxide is made at exposed edge 17 by a wiper 46 which functions as contact 26 of FIG. 4. Contact to the upper surface of semiconductor layers 15 is made by another wiper 48 which functions as contact 20 of FIG. 4. Alternatively, wiper 48 may be replaced by a contact roller (not shown) functioning as roller 38 of FIGS. 6–7. Laser beam 25 is scanned perpendicular to the direction of motion of substrate 12A. Shorts and shunting defects are located and removed in the inventive manner previously described. Since substrate 12A and oxide layer 13 are transparent, the laser beam for detecting and locating defects may be incident on the first uncoated surface of the substrate. Alternatively the laser beam may be situated to be incident directly upon the exposed surface of semiconductor layers 15. It is within the scope of this invention when practiced with transparent substrates that two laser beams may be used, one incident through the substrate and the second incident through the semiconductor layers. For example, a lower powered laser beam used to locate defects and shorts would enter through the substrate and a high powered laser beam would be incident on the exposed semiconductor surface.

The invention has been further particularly described with respect to scanning a photovoltaic structure comprising substrate and semiconductor materials. The layered structure is incomplete as a photovoltaic device requiring application of a second permanent electrical contact such as a grid or transparent conductive oxide in the case of an opaque substrate or a continuous metal layer in the case of a transparent substrate. The scanning and defect elimination is done in a manner which necessarily could not damage the second electrical contact since the scanning and defect elimination is accomplished even before the grid structure is applied. It is to be understood, however, as previously indicated, that the invention may also be practiced with essentially complete photovoltaic devices having both first and second electrical contacts made and affixed thereto.

As is readily apparent, the above invention is particularly advantageous in its manner of precisely locating and then immediately eliminating any shunting defect. The invention is also particularly advantageous in that it lends itself to mass production techniques such as continuous manufacture of thin film photovoltiac devices. Accordingly, the invention represents a significant advancement for increasing the durability and yield of such devices and may be readily applied to photovoltaic devices comprised of GaAs, $Zn_3P_2$, $CuInSe_2$, or polycrystalline silicon. As is further apparent, the above invention is advantageous in precisely locating and eliminating defects which affect the performance, yield and reliability of thin film semiconductor devices such as are useful for electrophotography, radiation detectors and optical displays.

What is claimed is:

1. In a method of manufacturing thin film photovoltaic cells including the steps of depositing at leasat first and second thin film semiconductor layers on a substrate and forming electrical contacts to the semiconductor layers, the improvement being applying a reverse bias voltage between the semiconductor layers, laser scanning the cell to selectively locate localized shorting or shunting defects therein whereby material from one of the cell components on one side of one of the thin film semiconductor layers would thereby contact a cell component on the other side of that semiconductor layer through the defect which would result in a short or shunt, and selectively thermally eliminating the defect to prevent such shorting.

2. In the method of claim 1 wherein the one semiconductor layer is adjacent to the substrate.

3. In the method of claim 2 wherein the scanning and eliminating steps take place before a second electrical contact is applied to the remote semiconductor layer.

4. In the method of claim 1 wherein the thermally eliminating step is done by applying an electrically conductive wire to the defect and applying current to the wire.

5. In the method of claim 1 wherein the thermally eliminating step is done by applying a laser beam to the defect.

6. In the method of claim 5 wherein the same laser equipment is used for both the scanning and thermally eliminating steps.

7. In the method of claim 6 wherein the scanning step is performed on the low power mode of the laser equipment, and the thermally eliminating step is performed on the high power mode of the laser equipment.

8. In the method of claim 7 wherein the scanning step includes applying as temporary electrical contacts wiper contacts which contact one of the semiconductor layers.

9. In the method of claim 1 wherein the semiconductor layers are oppositely doped regions of the same material.

10. In the method of claim 1 wherein the laser scanning creates an electrical response, recording the electrical response, and locating the defect by comparing the electrical response with a predetermined electrical response is representative of a defect.

11. In the method of claim 1 wherein the thin film photovoltaic cells are of the $Cu_2S/CdS$ type.

12. In the method of claim 1 wherein the thin film photovoltaic cells are of the $Cu_2S/Zn_xCd_{1-x}$ type.

13. In the method of claim 1 wherein the thin film photovoltaic cells are of the amorphous silicon type.

14. In the method of claim 1 wherein the thin film photovoltaic cells are of the $CuInSe_2$ type.

15. In an installation for the continuous manufacture of thin film photovoltaic cells wherein the installation includes a plurality of sequentially arranged stations for providing a substrate which includes a first electrical contact, for applying a first thin film semiconductor layer to the substrate, for applying a second thin film semiconductor layer to the first semiconductor layer, for applying a second electrical contact to the second semiconductor layer, the improvement being a localized shorting or shunting defect eliminating station being located between the second semiconductor application station and the second contact application station for selectively detecting and eliminating said localized shorting or shunting defects, and the shorting and shunting eliminating station including reverse bias laser scanning means for detecting the defect and thermal application means for selectively eliminating the defect.

16. In the installation of claim 15 wherein the defect eliminating station includes laser means having a low power mode and a high power mode wherein the same laser means functions to both detect and eliminate the defect.

17. In the installation of claim 15 wherein the eliminating station includes means for applying as temporary electrical contacts wiper contacts for contacting the second semiconductor layer.

* * * * *